United States Patent [19]

Anagnostopoulos

[11] Patent Number: 4,490,036
[45] Date of Patent: Dec. 25, 1984

[54] IMAGE SENSOR AND RANGEFINDER DEVICE HAVING BACKGROUND SUBTRACTION WITH PAIRED ANALOG SHIFT REGISTERS

[75] Inventor: Constantine N. Anagnostopoulos, Mendon, N.Y.

[73] Assignee: Eastman Kodak Company, Rochester, N.Y.

[21] Appl. No.: 409,256

[22] Filed: Aug. 18, 1982

[51] Int. Cl.³ .................... G01C 3/10; G03B 7/08
[52] U.S. Cl. .................................. 356/1; 354/403
[58] Field of Search .................... 356/1, 4; 354/403

[56] References Cited

U.S. PATENT DOCUMENTS

| | | | |
|---|---|---|---|
| 3,940,602 | 2/1976 | Lagnardo et al. | 235/181 |
| 4,178,098 | 12/1979 | Asano et al. | 356/4 X |
| 4,274,735 | 6/1981 | Tamura et al. | 356/1 |
| 4,334,150 | 6/1982 | Herbst et al. | 356/4 X |
| 4,334,151 | 6/1982 | Herbst et al. | 356/4 X |
| 4,368,978 | 1/1983 | Tsunekawa et al. | 356/4 X |
| 4,410,261 | 10/1983 | Masunaga et al. | 356/4 X |

Primary Examiner—S. C. Buczinski
Assistant Examiner—John B. Sotomayor
Attorney, Agent, or Firm—Thomas H. Close

[57] ABSTRACT

A rangefinder device includes means for projecting a beam of light to illuminate a spot on an object in a scene, an image sensor for sensing an image of the scene, and signal processing means responsive to signals produced by the image sensor for determining the relative location of the illuminated spot in the image of the scene to determine the distance to the object. The rangefinder device features means for removing the contribution due to ambient scene illumination from the photosignals, including an improved image sensor having an array of photosensors and a pair of analog shift registers for receiving the photosignals from the array of photosensors. One of the analog shift registers receives photosignals from the photosensor array when the beam is turned off, and the other analog shift register receives photosignals from the array when the beam is turned on. The shift registers are read out simultaneously and the signals therefrom are differenced to yield a series of photosignals free from background scene information. The difference signals are supplied serially to a peak detector to determine the location of the illuminated spot. In a preferred embodiment, the rangefinder is designed to operate from a single low voltage power source.

5 Claims, 9 Drawing Figures

4,490,036

IMAGE SENSOR AND RANGEFINDER DEVICE HAVING BACKGROUND SUBTRACTION WITH PAIRED ANALOG SHIFT REGISTERS

BACKGROUND OF THE INVENTION

Cross Reference to Related Applications

Reference is hereby made to the following copending U.S. patent applications filed on even date herewith.

Ser. No. 06/409,257, entitled "Image Sensor and Rangefinder Device Having Background Subtraction with Bridge Network" by L. Frank and C. Anagnostopoulos;

Ser. No. 06/409,259, entitled "Image Sensor and Rangefinder Device with Background Subtraction Using Interlaced Analog Shift Register" by D. Lambeth; and Ser. No. 06/409,258, entitled "Rangefinder Device with Serial Readout Linear Image Sensor and Peak Detector with Threshold Setting Means" by D. Lambeth.

FIELD OF THE INVENTION

The present invention relates to automatic rangefinders and image sensors for use therein, and more particularly to such rangefinders of the type wherein a beam of light is projected on a scene to illuminate a spot on an object, and an array of photosensors sense the location of the spot in an image of the scene to determine the distance to the object in the scene.

DESCRIPTION OF THE PROBLEM

In one type of automatic rangefinder, a beam of light is projected upon an object in a scene to form an illuminated spot on the object. An image of the scene including the illuminated spot, is formed on a linear array of photosensors. The location of the illuminated spot along the linear array is determined to measure the distance to the object in the scene. Such rangefinding devices find application for example in automatic focusing cameras.

The general arrangement of elements and mode of operation of such a rangefinding device will be described with reference to FIG. 1. Means for projecting a beam of light is shown by way of example as a light emitting diode (LED) 10 and a lens 12. The beam is projected along a path 14 to illuminate a spot on an object $O_1$ in a scene. The scene is imaged by a second lens 16 onto a linear array of photosensors 18. The signals produced by the photosensors are analyzed by control electronics 20 to determine the position of the illuminated spot in the scene and produce a signal representing the distance to the object.

As shown by example in FIG. 1, the apparent position of the illuminated spot in the scene is a function of distance along light path 14 to the object. For an object $O_1$ located at a distance $D_1$ from the rangefinding device, the image of the illuminated spot will fall on the sensor array at location $S_1$. For an object $O_2$ at a further distance $D_2$, the image of the spot will fall on the sensor array at location $S_2$. By examining the output of the sensor array, the control electronics determines (for example, by comparing the outputs of the elements to determine that output which is a maximum) the location of the illuminated spot in the scene and thereby the distance to the object.

When the ambient illumination is relatively bright, the scene itself, regardless of the illuminated spot, will produce substantial modulation of the photosensor array. Under such circumstances, it is not possible to determine the location of the illuminated spot merely by examining the outputs of the photosensors. The effects of ambient scene light can be removed however by operating the sensor with the beam off and again with the beam on, and subtracting the signals produced thereby. The information in the difference signal is solely from the illuminated spot. One way of accomplishing this subtraction is shown in U.S. Pat. No. 4,274,735 issued June 23, 1981 to Tamura et al. Tamura et al disclose a device having a pair of memory capacitors associated with each photosensor in the array. The capacitors are selectively connectable to the photosensors by field effect transistor (FET) switches, and each pair is further connectable to an associated differential amplifier. In operation, a photosensor is first connected to one of the capacitors while the light beam is off. The photosensor is then connected to the other capacitor while the light beam is on. Both the capacitors are then connected to the differential amplifier to produce a photosignal free from background information. The photosignals are compared in an array of comparators to determine the location of the illuminated spot by sensing the largest difference signal produced by the array of differential amplifiers.

To effectively remove the relatively large background photosignal from the relatively small photosignal due to the illuminated spot, each of the differential amplifiers must have very good common mode rejection. Furthermore, so that the amplifiers themselves do not introduce overwhelming pattern noise into the photosignals, they must be very closely matched. The need for a plurality of closely matched differential amplifiers exacts a high price on any attempt to increase the signal-to-noise ratio of the device. Furthermore, the use of an array of comparators to determine the maximum difference signal from the differential amplifiers complicates the signal processing circuitry.

There was a need therefore, to simplify the signal processing electronics of the rangefinder while improving the signal-to-noise ratio achievable therein.

SOLUTION TO THE PROBLEM—SUMMARY OF THE INVENTION

The above-noted problems are solved according to my invention by providing a rangefinder device of the type described above with an improved image sensor and signal processing means. The image sensor includes an array of photosensors and a pair of analog shift registers for receiving photosignals from the array of photosensors. One of the analog shift registers receives photosignals generated by the array of photosensors when the light beam is turned off, and the other analog shift register receives the photosignals generated by the array when the light beam is turned on. The analog shift registers are read out simultaneously, and the serial pairs of signals therefrom are differenced to yield a series of photosignals free from ambient scene information. The difference signals are supplied serially to a peak detector to determine the relative location of the illuminated spot in a scene. According to one feature of the invention, the array of photosensors is an array of photodiodes integrated on a common substrate with the pair of analog shift registers, which comprise buried channel CCD shift registers coupled to the photodiode array by surface channels. By this means, the sensitivity of the range finder is increased while allowing the device to be operated from a single low voltage power supply.

According to a further aspect of the invention, the buried channel CCD shift registers are provided with output preamplifiers comprising buried channel FET's, thus making the output amplifiers likewise operable at the single, low voltage power.

BRIEF DESCRIPTION OF THE DRAWINGS

The invention will be described with reference to the accompanying drawings, wherein.

DESCRIPTION OF THE PREFERRED EMBODIMENTS

Figure 1:
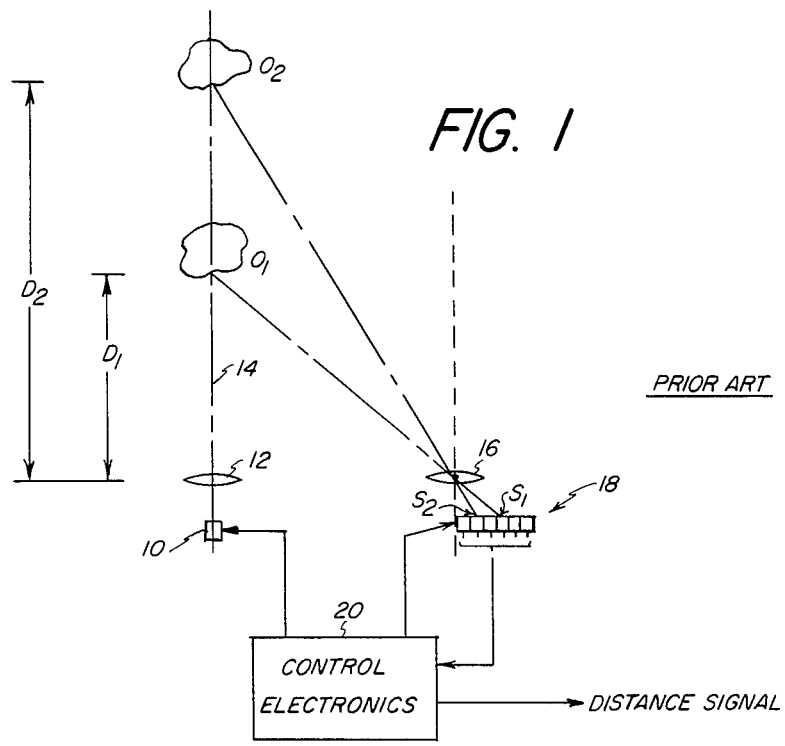
FIG. 1 is a schematic diagram of a rangefinder of the type to which the present invention pertains.
Figure 2:
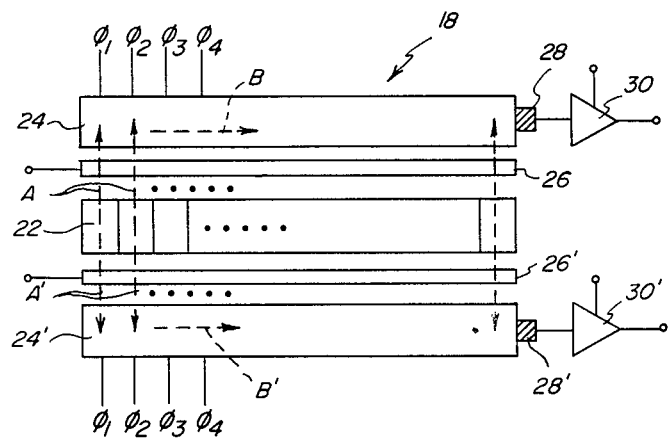
FIG. 2 is a schematic diagram of the image sensor including a photosensor array and a pair of analog shift registers according to the present invention.

Referring first to FIG. 2, a linear image sensor 18 according to the present invention is shown. The image sensor includes a linear array of photosensors such as photodiodes 22 and a pair of charge coupled device (CCD) shift registers 24 and 24'. Corresponding elements of the CCD shift registers are similarly numbered, and will be distinguished by the use of primes (') when required. A transfer gate 26 between the array of photosensors 22 and CCD shift register 24 is actuable for transferring photocharge (in the direction of arrows A) from the sensor elements into the shift register 24. A second transfer gate 26' between the photosensor array 22 and the second shift register 24' is actuable for transferring photocharge (in the direction of arrows A') from the sensor elements to the second shift register. In the preferred embodiment of the invention, the CCD shift registers are of the buried channel variety to maximize their transfer efficiency and hence the signal-to-noise ratio of the device, and the transfer channels created by the transfer gates 26 and 26' are surface channels thereby enabling a single low voltage power supply (e.g. 5 Volts) to be employed to power the device.

The signals in the CCD shift register 24 are shifted serially in the direction of arrow B to an output diode 28 by applying four-phase clock signals $\Phi_{1-4}$ to the transfer electrodes of the CCD shift register. The photosignals are detected at the output diode by a preamplifier 30 which is specially configured as described below to operate from the single low voltage power supply.

Figure 3:
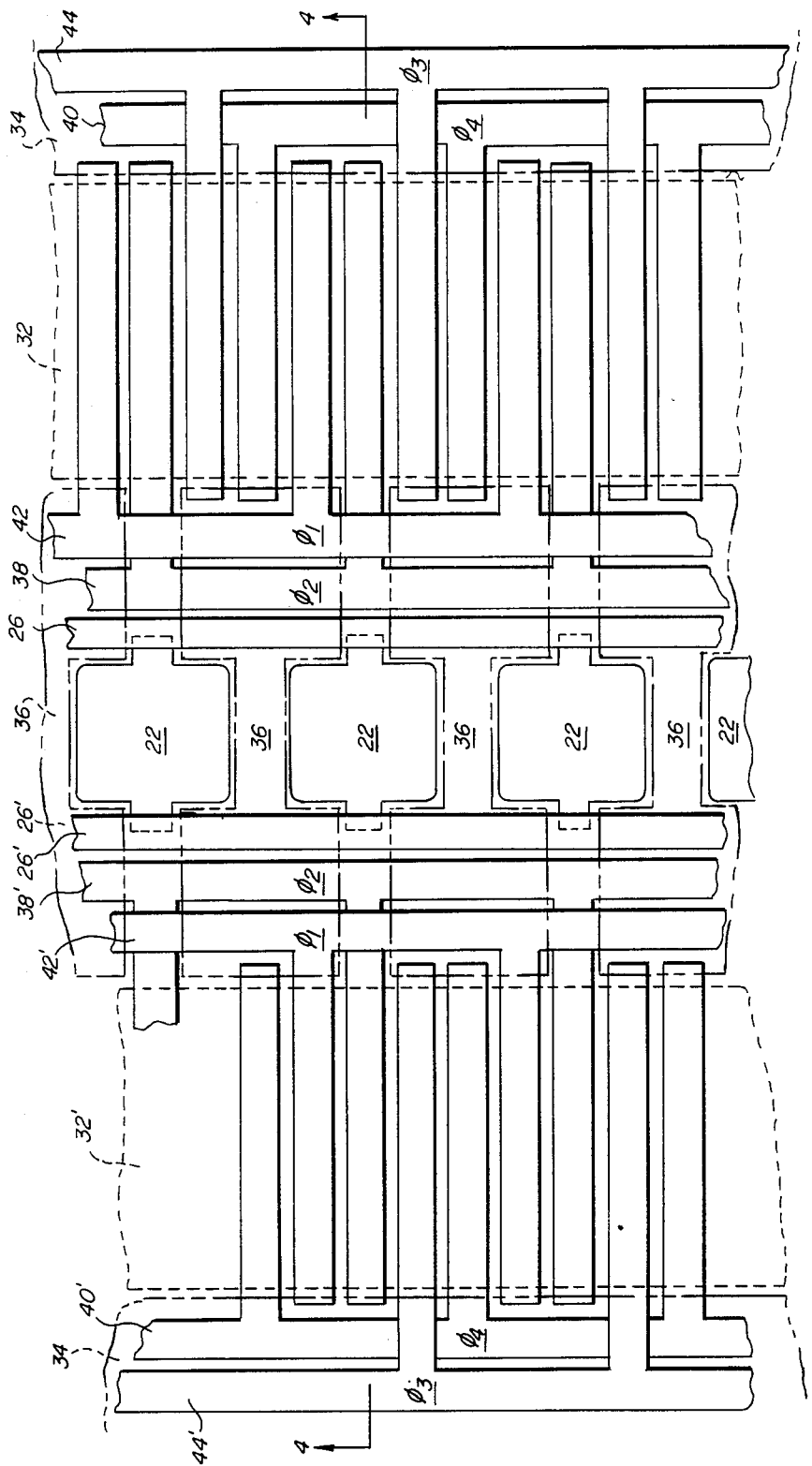
FIG. 3 is a partial plan view showing the electrode and channel structure of the image sensor shown in FIG. 2.

FIG. 3 is a partial plan view illustrating the electrode and channel structure of the linear photosensor array and associated CCD readout shift registers. The buried channel for the CCD shift register 24, comprising for example an n-type region 32 in a p-type silicon substrate is shown by dotted lines. Channel stopping regions 34 confining the outer edges of the CCD shift registers comprising for example (p+)-type regions under a thickened field oxide are shown by chain lines. The photodiodes 22 are formed by (n+)-type diffusions in the areas defined between the dumbbell-shaped channel stopping regions 36 in the center of the device.

Two levels of polysilicon overlying the channels define the electrode structure of the device. A first level of polysilicon defines the phase-2 and phase-4 electrodes (38 and 40 respectively) of the CCD shift registers, and a second level defines the phase-1 and phase-3 electrodes (42 and 44 respectively) of the CCD shift registers and the transfer gates 26 and 26'. The phase-2 electrodes and the transfer gates form surface channels that couple the photodiodes 22 to the CCD shift registers.

Figure 4:
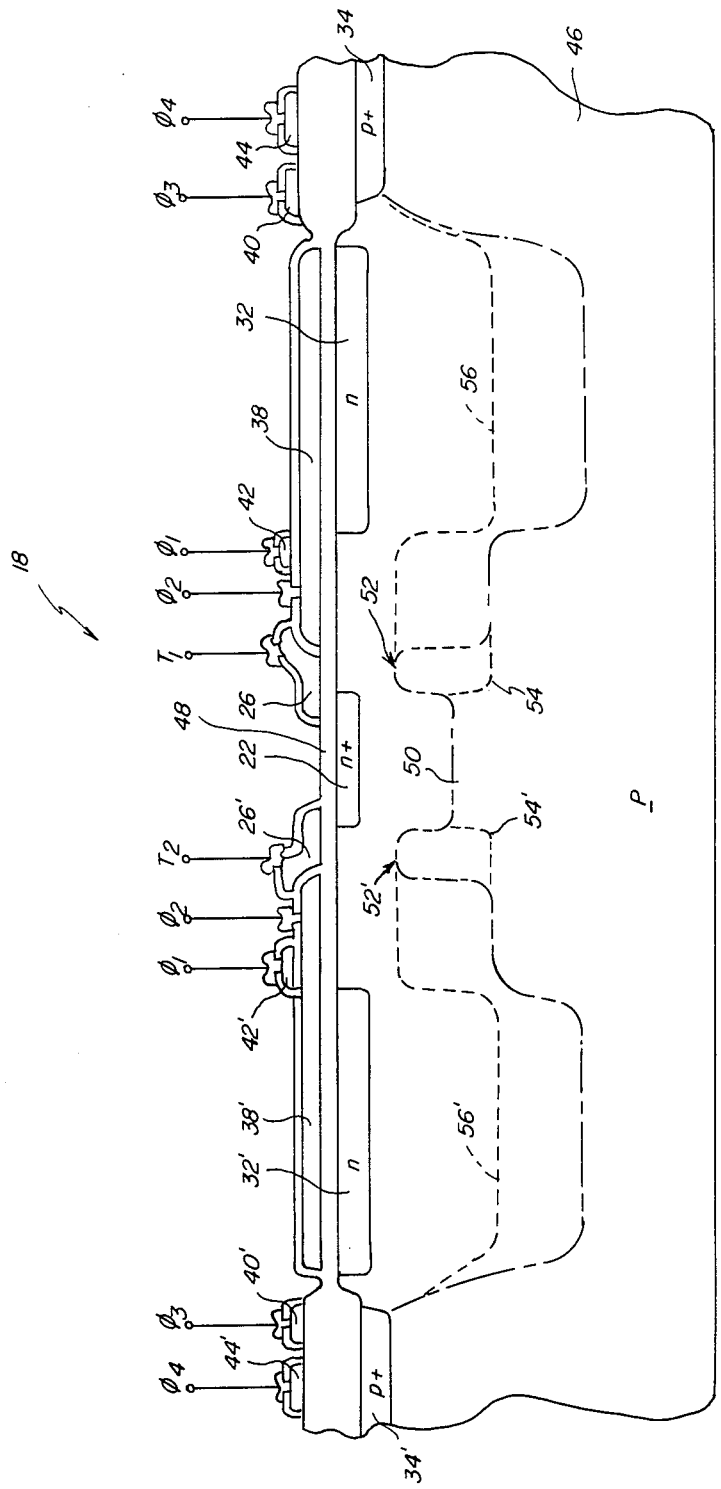
FIG. 4 is a schematic cross-sectional view and potential diagram of the image sensor showing the photosensor array and readout shift registers taken along line 4—4 in FIG. 2.

FIG. 4 is a partial, cross-sectional view of the image sensor taken along lines 4—4 in FIG. 3, showing the channel structure of the image sensor.

Image sensor 18 is formed in a p-type silicon substrate 46. The CCD buried channels are defined by n-type regions 32. The photodiodes are formed by (n+)-type regions 22. A layer of silicon dioxide 48 overlies the doped regions of the device. Chain line 50 depicts the potential profile across the device when 0 volts is applied to the transfer gates 26 and 26' and 5 volts is applied to the phase-2 electrodes 38 and 38'. Potential barriers 52 and 52' keep photocharge generated in the photodiode from flowing into either of the CCD shift registers. If 5 volts is applied to either transfer gate 26 or 26', the potential barrier thereunder is lowered to the position shown by dotted lines 54 or 54' respectively and allows the photocharge in the photodiode to flow into the respective CCD shift register beneath the phase-2 electrode via the surface channel created thereunder. When the 5-volt potential is removed from the transfer gate and the phase-2 electrode, the potential well thereunder collapses as shown by dotted lines 56 and 56'. Charge in the shift register is moved in a direction perpendicular to the plane of the drawing by pulsing the 4-phase transfer electrodes in the conventional manner for moving charge in a CCD shift register. The use of a surface channel to couple the photodiode 22 with the buried channel CCD shift register enables the sensor to operate at a single low voltage (e.g. 5 volts), thereby simplifying the power supply requirements for the device.

Figure 5:
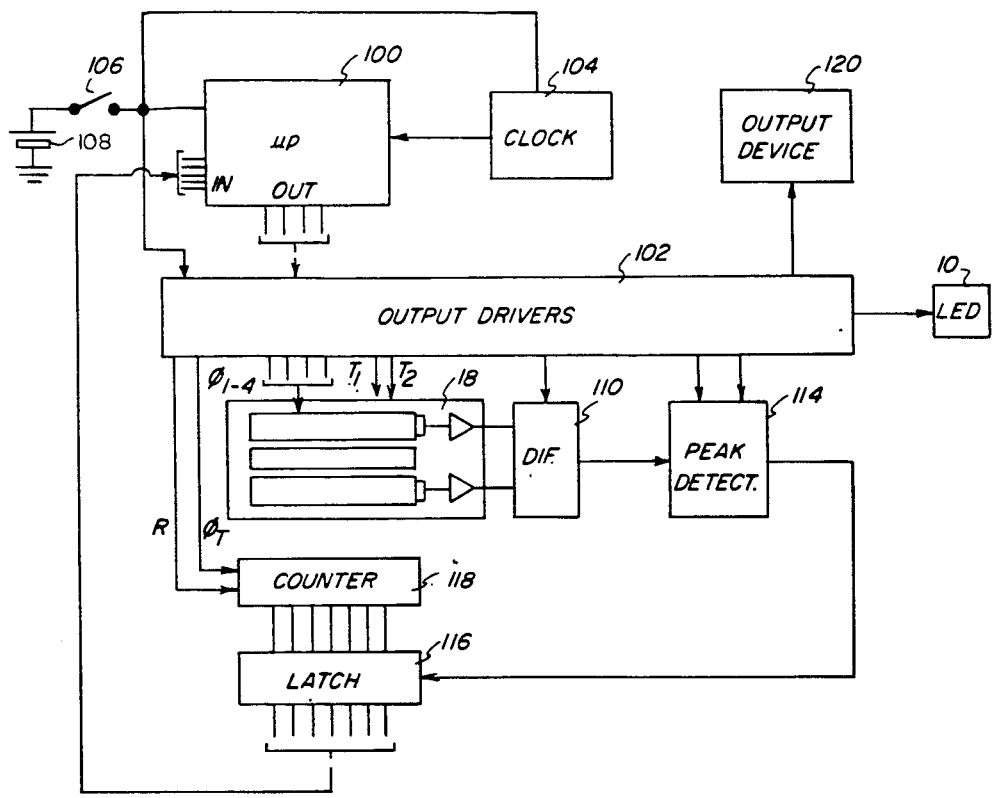
FIG. 5 is a schematic block diagram showing the signal processing and control electronics of a rangefinder according to the present invention.

Referring now to FIG. 5, overall control of the rangefinder is provided by a programed microprocessor 100 via conventional driver circuits 102. The microprocessor is supplied with timing signals from a clock circuit 104 and with power via a main power switch 106 from a battery 108. Four-phase clock signals $\Phi_{1-4}$ and transfer signals $T_1$ and $T_2$ are supplied to the linear sensor array 18 from drivers 102 under control of microprocessor 100 to produce output signals from the CCD shift registers of the sensor 18. The signals from the CCD shift registers are supplied to a differencing circuit 110. Difference signals produced by the differencing circuit 110 are supplied to a peak detector circuit 114. Features of the peak detector circuit are claimed in copending U.S. patent application No. 06/409,258, entitled "Rangefinder Device with Serial Readout Linear Image Sensor and Peak Detector with Threshold Setting Means" filed on even date herewith by D. N. Lambeth. The output of the peak detector circuit is supplied to a latch circuit 116. Latch circuit 116 is connected to the outputs of a digital counter 118. Counter 118 receives a reset signal R and a timing signal $\Phi_T$ having the same frequency as the four-phase clock signals $\Phi_{1-4}$. The output of the latch circuit 116 is supplied to an input port of microprocessor 100.

The driver circuits 102 also power the LED 10 and an output device 120 such as a range display or a range servo.

Figure 6:
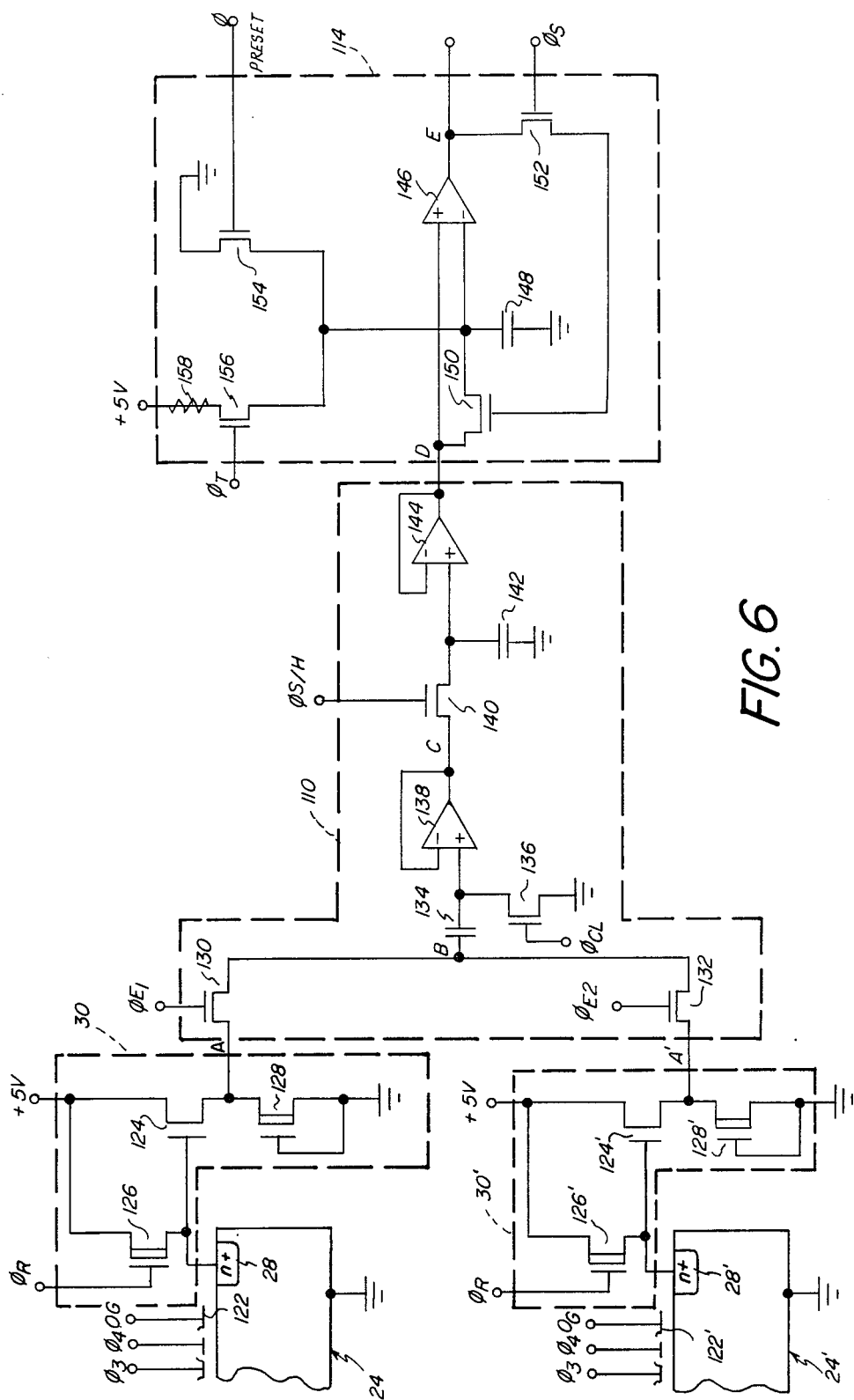
FIG. 6 is an electrical circuit schematic diagram showing the signal processing electronics for differencing and peak detecting according to the present invention.

FIG. 6 is a more detailed circuit schematic of the signal processing electronics shown in FIG. 5. A portion of the CCD shift registers 24 and 24' including output gates 122 and 122' and output diodes 28 and 28' is shown.

The output amplifier 30 is an on-chip, sense and reset amplifier including a sense FET 124 and a reset FET 126. The sense FET 124 is a surface channel device and the reset FET 126 is a buried channel device so that a single low voltage power supply can be used to power the apparatus. A buried channel FET 128 is connected between the drain of the FET 124 and ground in a constant current configuration for converting the sensed charge on diode 28 to a voltage at node A.

The differencing circuit 110, comprises multiplexing FETs 130 and 132 for sampling the outputs at modes A and A', a detection capacitor 134, a clamping FET switch 136, and an amplifier 138. Differencing circuit 110 includes a sample and hold portion comprising a sampling FET 140, a storage capacitor 142 and an amplifier 144.

The peak detector circuit 114 comprises a differential amplifier 146, a reference capacitor 148, a sampling FET switch 150, and a timing FET switch 152. The peak detector circuit contains a threshold setting portion comprising a preset FET switch 154 connecting capacitor 148 to ground, and a threshold setting FET switch 156 connecting the 5 volt power supply to capacitor 148 through a resistor 158.

Figure 7:
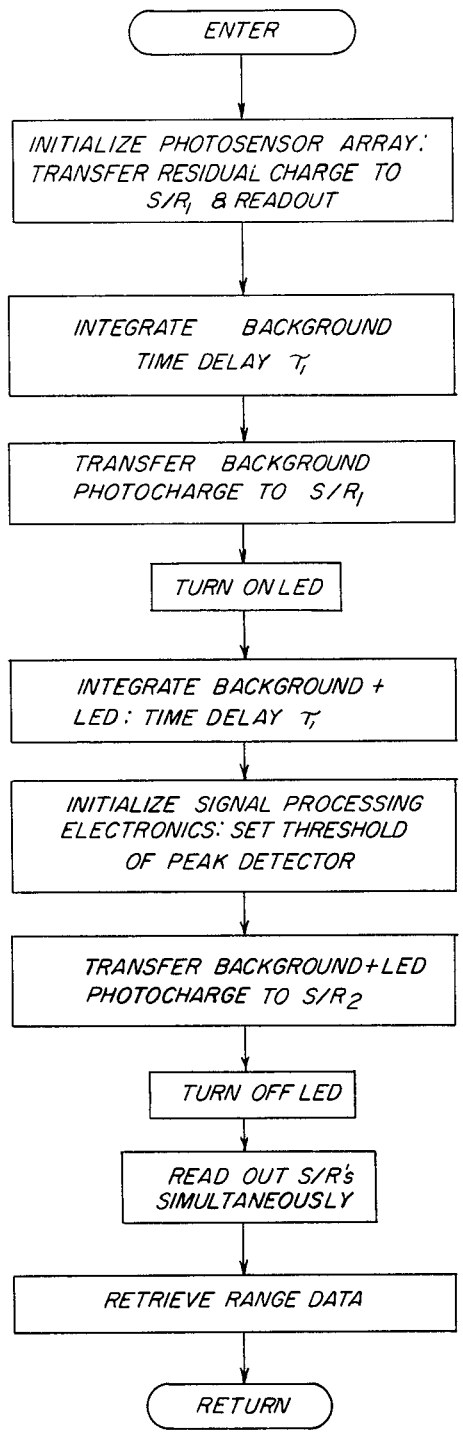
FIG. 7 is a flow chart showing the general operation of the rangefinder according to the present invention.
Figure 8:
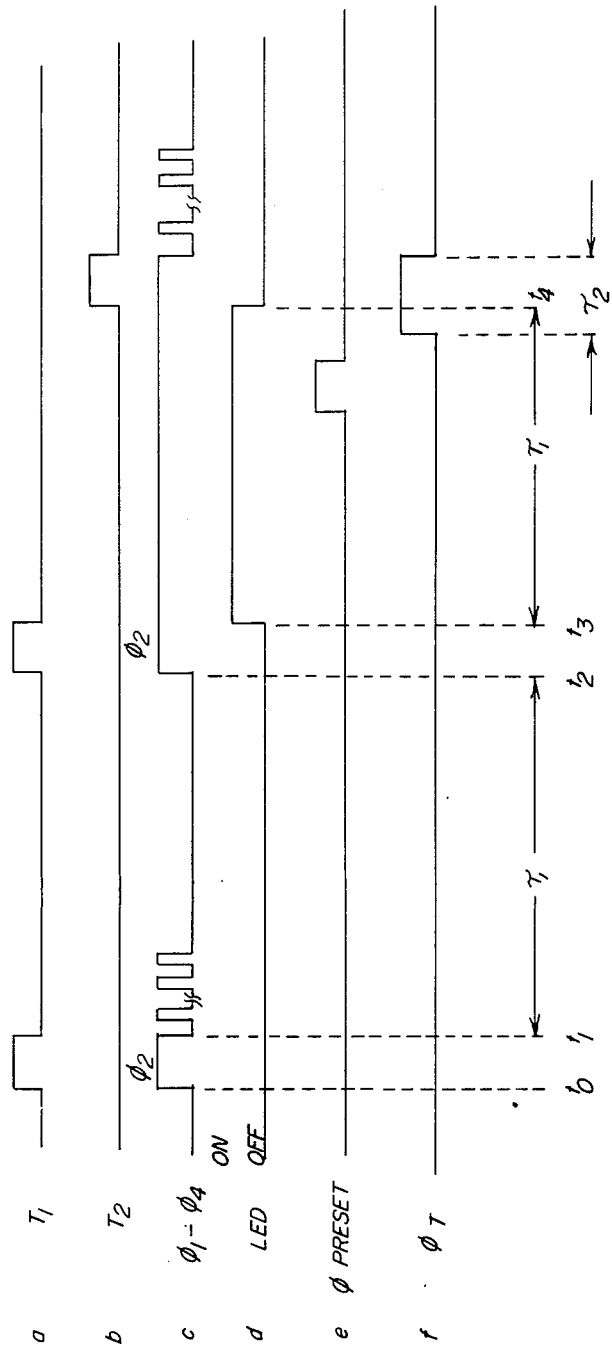
FIGS. 8 and 9 are timing diagrams useful in explaining the operation of the rangefinder according to the present invention.
Figure 9:
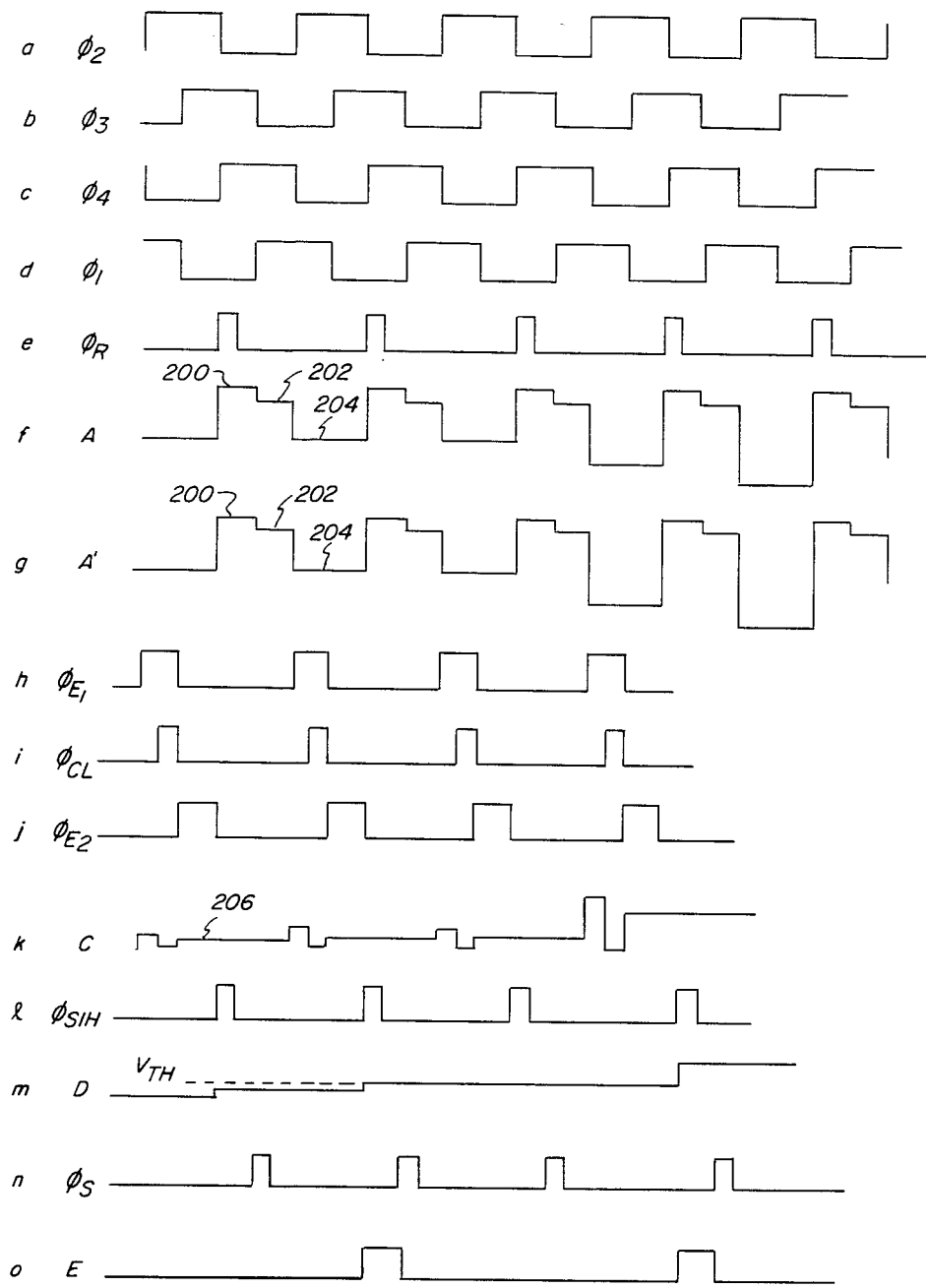

The operation of the rangefinder will now be described with reference to FIGS. 7, 8 and 9. FIG. 7 is a flow chart showing a control program for the microprocessor 100 (see FIG. 5). To begin, for example upon closure of main power switch 106 at time $t_0$, (see FIG. 8) the microprocessor initializes the photosensor array by transferring any accumulated photocharge from photosensors 22 into shift register 24 by applying a $T_1$ transfer pulse to transfer gate 26, (FIG. 8a) while phase two ($\Phi_2$) of the four-phase clock signals is held high and then applying the four-phase clock signals $\Phi_{1-4}$ to both CCD shift registers to empty any residual charge therein (FIG. 8c). Meanwhile, at time $t_1$ the microprocessor executes a time delay $\tau_1$ to accumulate background photocharge due to ambient scene illumination in the photosensor array. After time delay $\tau_1$, at time $t_2$, the background photocharge is transferred to the first CCD shift register 24 by holding $\Phi_2$ high and again pulsing transfer gate 26 (see FIGS. 8a and c).

Next, at time $t_3$, the microprocessor turns on LED 10, while $\Phi_2$ is held high (see FIGS. 8c and 8d). LED 10 is kept on for a time $\tau_1$, during which, the signal processing circuitry is initialized to set the threshold of the peak detector. FET switch 154 (see FIG. 6) is turned on momentarily by generating a $\Phi_{preset}$ pulse (see FIG. 8e) to ground capacitor 148. Then, FET switch 156 is turned on for a time $\tau_2$ to charge capacitor 148 to a value determined by the time constant of resistor 158 and capacitor 148. At time $t_4$, the LED is turned off and the background plus LED photosignals generated by the sensor array are transferred to the second CCD shift register 24' by applying a pulse $T_2$ to transfer gate 26' (see FIG. 8b). Both CCD shift registers are then read out simultaneously to generate the range signal by applying the four-phase clock signals $\Phi_{1-4}$ to the four-phase transfer electrodes 38, 40, 42, and 44 (see FIG. 8c).

Processing of the photosignals from the CCD's will now be described with reference to FIG. 9. The four-phase clock signals $\phi_{1-4}$ are shown in FIGS. 9a–d. While the signal charge resides under the phase-3 and phase-4 electrodes, 44 and 40 respectively, ($\Phi_3$ and $\Phi_4$ simultaneously high) a reset pulse $\Phi_R$ is applied to buried channel FET transistors 126 and 126' to prepare the output diodes to receive the signal charge. At this point, the outputs A and A' of the CCD shift registers go to a high level (200 in FIGS. 9f and 9g). When the phase-3 transfer gate goes low, some of the signal charge spills over the output gates onto the output diode, and the outputs go to the intermediate level 202 in FIGS. 9f and 9g. Finally, when the voltage on the phase-four transfer gate goes low, all the signal charge is moved to the output diodes 28 and 28' and the output signal at A and A' go to their final signal levels 204 as shown in FIGS. 9f and 9g.

During an initial portion of the time that the final signal levels are present at nodes A and A', a pulse $\Phi_{E1}$ is applied to sampling transistor 130, thereby storing the background level present at node A on capacitor 134 (see FIG. 9h). During the $\Phi_{E1}$ pulse, a pulse $\Phi CL$ is applied to clamping transistor 136 to establish the voltage present at node A as a reference on capacitor 134. During a later portion of the time that the final signal level is present, a pulse $\Phi_{E2}$ is applied to sampling transistor 132. The resulting voltage on the capacitor is the difference between the "background" signal and the "background plus the LED" signal. The output at node C of amplifier 138 follows this difference as shown in FIG. 9k. The difference level 206 is sampled and held on the output of amplifier 144 at node D by pulsing FET 140 with a sampling pulse $\Phi S/H$ (see FIG. 9l).

The voltage at node D is a step-wise smooth curve representing the successive values of the difference signal (see FIG. 9m). Differential amplifier 146 compares the first sample with a threshold value $V_{TH}$ (see FIG. 9m) stored on capacitor 148. If the sampled value is less than the threshold value, the output of amplifier 146 at node E remains low, however if the sampled value exceeds the threshold value, the output at node E goes high. At a point during the sample period, a sampling signal $\Phi_S$ (see FIG. 9n) is applied to FET transistor 152. If the voltage at node E is low at this time, the low value will be applied to the gate of transistor 150 and will have no effect upon the state of the circuit. If, however, the voltage at node E is high, the high value will be applied to the gate of transistor 150, thereby applying the new higher reference voltage to capacitor 148. The new reference value is equal to the input at node D thereby causing the output at node E of differential amplifier 146 to go low (see FIG. 9o). This process continues, producing a pulse at node E each time a new greater difference signal is received from the difference circuit 110.

At the start of the sequence, counter 118 is initialized. Each time a new charge packet is read from the CCD shift registers, counter 118 is advanced (see FIG. 5). The pulse train produced by the peak detector at node E is applied to latch 116 which latches the output of counter 118 whenever a new pulse is produced by the peak detector. After all the charge packets in the CCD shift registers have been read out, the count held by latch 116 is indicative of the location of the sensor element having the greatest illumination from the LED above the threshold level. At this point, the microprocessor retrieves the range data from the latch by interrogating its input port.

The range data are then used in known manner to drive an output device such as a range display or a range servo.

Thus a rangefinding device has been disclosed having an improved image sensor and simplified signal processing electronics affording improved signal-to-noise ratio and capable of being operated from a single low voltage power supply, thereby simplifying the power supply requirements of the device.

The invention has been described with reference to a preferred embodiment thereof, however, it will be apparent that changes and modifications can be effected within the spirit and scope of the accompanying claims.

What is claimed is:

1. A range finder, comprising:
   means energizable for projecting a beam of light to illuminate a spot on an object in a scene;
   a linear array of photosensors responsive to light for generating a photosignal proportional to the quantity of light falling thereon;
   means for forming an image of a portion of the scene containing the illuminated spot on said array;
   first and second analog shift register means for receiving, in parallel, a plurality of analog signals, and responsive to control signals for delivering said analog signals serially to first and second output means respectively;
   first and second means actuable for transferring the photosignals in said array to said first and second analog shift register means respectively;
   control means for energizing said light beam and actuating said first transfer means, for deenergizing said light beam and actuating said second transfer means, and for supplying control signals simultaneously to said first and second analog shift register means to cause the photosignals therein to be delivered in synchronism to said first and second output means respectively;
   differential means connected to said first and second output means and responsive to the photosignals thereat to form difference signals; and
   signal processing means responsive to said difference signals for detecting the location of the image of said illuminated spot on said array and producing a distance signal in response thereto.

2. The invention claimed in claim 1, wherein said photosensors comprise photodiodes, said analog shift register means comprise buried channel CCD shift registers, and said transfer means comprise transfer gates for forming surface channels between said photodiodes and said buried channel CCD shift registers, whereby said automatic range finder may be operated by a single low voltage power supply.

3. The invention claimed in claim 2, further comprising sense and reset FET preamplifiers associated with each of said CCD shift registers, wherein the reset FET of said preamplifier is a buried channel FET and the sense FET is a surface channel FET, whereby said sense and reset preamplifiers are operated by the single low voltage power supply.

4. A rangefinder of the type having means for projecting a beam of light to illuminate a spot on an object in a scene, an image sensor for sensing the light from a scene and producing photosignals representative thereof, and means responsive to the photosignals for detecting the position of the illuminated spot in the scene to determine the distance to the object, said rangefinder including means for removing background noise from the photosignals produced by the image sensor by sensing the scene with the light beam on and again with the light beam off, and forming difference signals from the photosignals produced thereby, characterized in that said image sensor includes: (1) an array of photosensors (22) responsive to incident light for producing photosignals, (2) first and second analog shift registers (24 and 24'), adjacent the array of photosensitive elements, for receiving a plurality of signals in parallel and shifting the signals serially to an output location, (28 and 28') (3) first and second transfer gates (26 and 26') located respectively between the array of photosensitive elements and the first and second analog shift registers, for selectively transferring the photosignals produced by the photosensitive elements into the respective shift registers,
   whereby, the photosignals produced with the light beam on are transferred to the first shift register, and the photosignals produced with the light beam off are transferred to the second shift register, and the shift registers are read out simultaneously to deliver the photosignals to a differencing circuit.

5. The invention claimed in claim 4, further characterized by said photosensitive elements (22) being photodiodes, said analog shift registers (24 and 24') being buried channel charge coupled device shift registers, and said transfer gates (26 and 26') being actuable for forming surface channels between said photodiodes and said buried channel CCD shift registers,
   whereby, the image sensor may be operated from a single low voltage power supply.

* * * * *